US009710216B2

(12) United States Patent
Huang et al.

(10) Patent No.: US 9,710,216 B2
(45) Date of Patent: Jul. 18, 2017

(54) FRAMEWORK FOR FORMING ELECTRONIC DISPLAY FROM PLURALITY OF ELECTRONIC DEVICES

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Tong-Qi Huang, Wuhan (CN); Chun-Sheng Chen, New Taipei (TW)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 85 days.

(21) Appl. No.: 14/789,187

(22) Filed: Jul. 1, 2015

(65) Prior Publication Data
US 2016/0342373 A1 Nov. 24, 2016

(30) Foreign Application Priority Data

May 19, 2015 (CN) .......................... 2015 1 0255089

(51) Int. Cl.
*G06F 3/14* (2006.01)
*H05K 5/02* (2006.01)
*H05K 5/00* (2006.01)

(52) U.S. Cl.
CPC ......... *G06F 3/1446* (2013.01); *H05K 5/0017* (2013.01); *H05K 5/0065* (2013.01); *H05K 5/0247* (2013.01); *G09G 2300/026* (2013.01); *G09G 2370/22* (2013.01)

(58) Field of Classification Search
CPC ................ G06F 3/1423; G06F 3/1446; G09G 2300/026
See application file for complete search history.

(56) References Cited

U.S. PATENT DOCUMENTS

| | | | |
|---|---|---|---|
| 6,429,903 B1* | 8/2002 | Young | G06F 3/14 348/552 |
| 2011/0122048 A1* | 5/2011 | Choi | G06F 3/1446 345/1.1 |
| 2014/0211426 A1* | 7/2014 | Chen | G06F 3/1423 361/748 |
| 2014/0351722 A1* | 11/2014 | Frederickson | G06F 9/4443 715/761 |
| 2016/0041805 A1* | 2/2016 | Joo | G06F 3/1446 345/205 |

* cited by examiner

*Primary Examiner* — Larry Sternbane
(74) *Attorney, Agent, or Firm* — Steven Reiss

(57) ABSTRACT

A framework for forming an electronic display includes a primary electronic device, at least one coupling electronic device, and at least one secondary electronic device. The primary electronic device includes a system on a chip electronically coupled to a display screen of the primary electronic device. The at least one coupling electronic and the at least one secondary electronic device each includes an integrated circuit and a corresponding display screen. Each electronic device includes at least one connector configured to electronically couple to the connector of another electronic device. The system on a chip of the primary electronic device controls the display screen of each of the electronic devices to display a portion of the electronic display.

17 Claims, 11 Drawing Sheets

FRAMEWORK FOR FORMING ELECTRONIC DISPLAY FROM PLURALITY OF ELECTRONIC DEVICES

FIELD

The subject matter herein generally relates to electronic displays, and more particularly to a framework for forming a composite electronic display from a plurality of electronic devices, wherein each electronic device displays a portion of the electronic display.

BACKGROUND

As electronic devices have become more common, the ability to display data and information thereon has increased. The size of a portable display is often limited as it must be held in one or two hands of a user. Additionally, smaller electronic devices are more portable than larger electronic devices.

BRIEF DESCRIPTION OF THE DRAWINGS

Implementations of the present technology will now be described, by way of example only, with reference to the attached figures.

DETAILED DESCRIPTION

Figure 1:
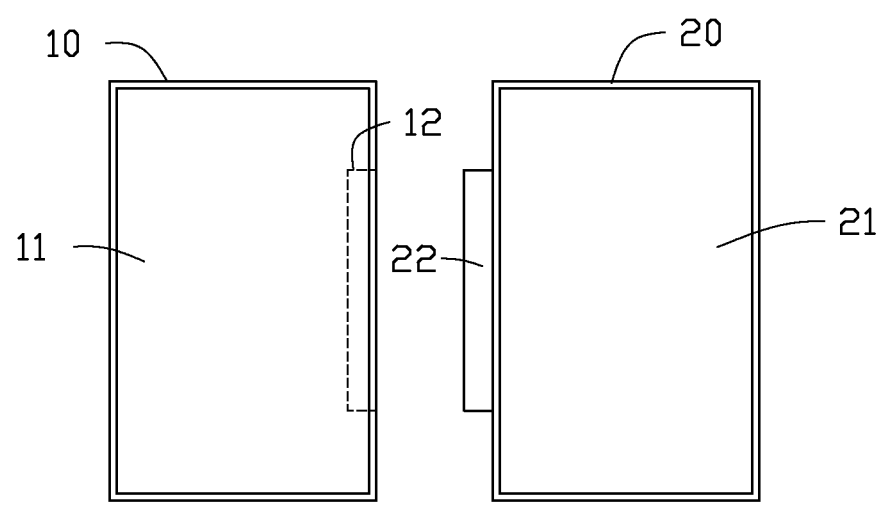
FIG. 1 is a diagrammatic view of a first embodiment of a framework for forming an electronic display.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

Figure 2:
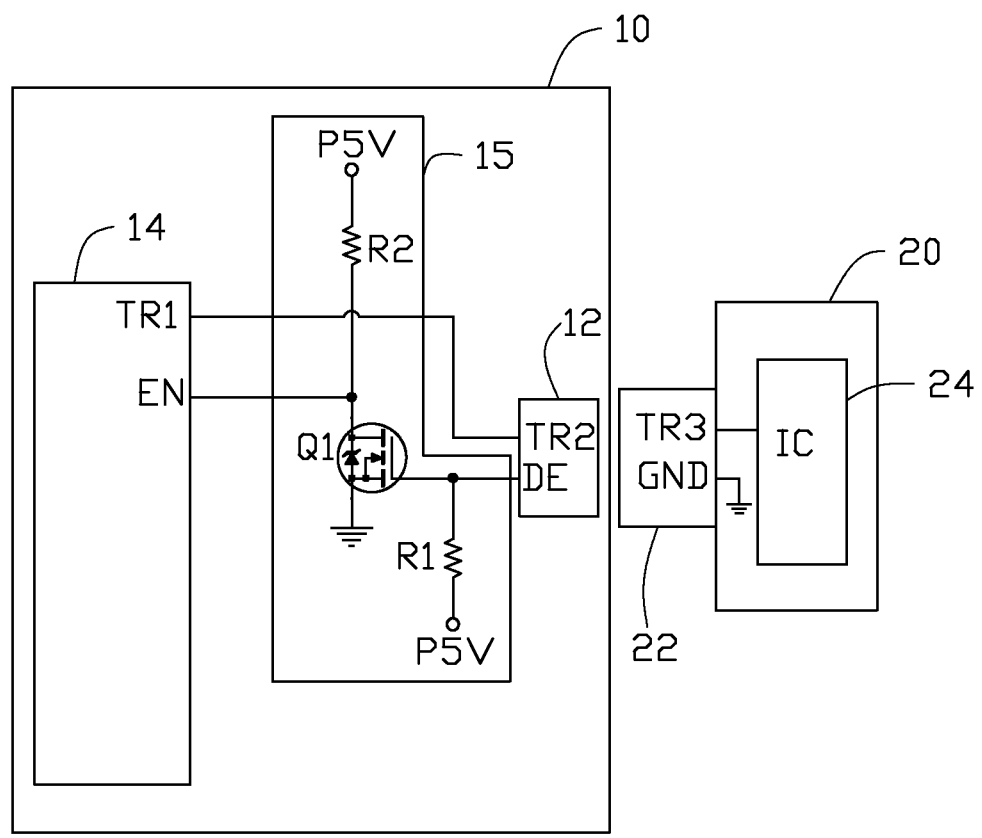
FIG. 2 is a circuit diagram of FIG. 1.
Figure 3:
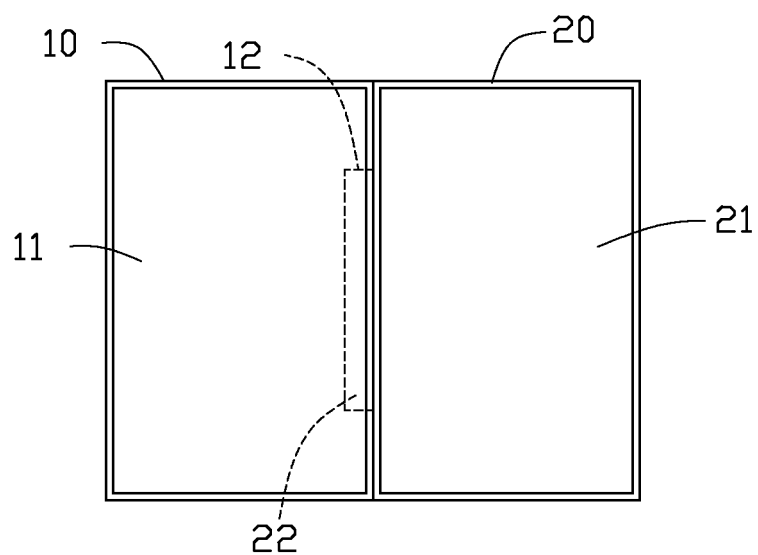
FIG. 3 is similar to FIG. 1, but shows the framework in an assembled state.

FIGS. 1-3 illustrate a first embodiment of a framework for forming a composite electronic display from a first electronic device 10 and a second electronic device 20. Referring to FIG. 1, the first electronic device 10 can include a first display screen 11, and the second electronic device 20 can include a second display screen 21. The first electronic device 10 can include a first connector 12, and the second electronic device 20 can include a second connector 22. In the illustrated embodiment, the first connector 12 is a female connector, and the second connector 22 is a male connector. In another embodiment, the first connector 12 can be a male connector, and the second connector 22 can be a female connector. The second electronic device 20 can be electronically coupled to the first electronic device 10 by the second connector 22 electronically coupling to the first connector 12. When the second electronic device 20 is electronically coupled to the first electronic device 10, the first electronic device 10 can control the first display screen 11 to display a first portion of an electronic display and control the second display screen 21 to display a second portion of the electronic display. Thus, the first electronic device 10 and the second electronic device 20 can cooperatively form an electronic display spanning the first display screen 11 and the second display screen 21.

Referring to FIG. 2, the first electronic device 10 can include a system on a chip 14 electronically coupled to the first display screen 11. The first electronic device 10 can also include a control module 15. The first connector 12 can be electronically coupled to the system on a chip 14 through the control module 15. The second electronic device 20 can include an integrated circuit 24 electronically coupled to the second display screen 21. When the second connector 22 is electronically coupled to the first connector 12, the system on a chip 14 can control the first display screen 11 to display the first portion of the electronic display and control the second display screen 21 through the integrated circuit 24 to display the second portion of the electronic display.

The system on a chip 14 can include a first transmission pin TR1 and an enabling pin EN. The first connector 12 can include a second transmission pin TR2 and a detection pin DE. The second connector 22 can include a third transmission pin TR3 and a ground pin GND. The first transmission pin TR1 and the enabling pin EN of the system on a chip 14 can be electronically coupled to the second transmission pin TR2 and the detection pin DE of the first connector 12 through the control module 15. When the second connector 22 is electronically coupled to the first connector 12, the second transmission pin TR2 and the detection pin DE can be electronically coupled to the third transmission pin TR3 and the ground pin GND, respectively.

The control module 15 can include an electronic switch Q1, a first resistor R1, and a second resistor R2. The electronic switch Q1 can include a first terminal, a second terminal, and a third terminal. The first terminal can be electronically coupled to a power source P5V through the first resistor R1, and electronically coupled to the detection pin DE of the first connector 12. The second terminal of the electronic switch Q1 can be electronically coupled to a power source P5V through the second resistor R2, and further electronically coupled to the enabling pin EN of the system on a chip 14. The third terminal of the electronic switch Q1 can be grounded. When the second electronic device 20 is electronically coupled to the first electronic device 10, the detection pin DE of the first connector 12 electronically coupled to the ground pin GND of the second connector 22 transmits a low-level voltage signal to the electronic switch Q1, thereby closing the electronic switch Q1. The closed electronic switch Q1 sends a high-level voltage signal to the enabling pin EN of the system on a chip 14. The first transmission pin TR1, upon the enabling pin EN receiving the high-level voltage signal, transmits data to the integrated circuit 24 of the second electronic device 20 through the second transmission pin TR2 and the third transmission pin TR3. The system on a chip 14, upon the first transmission pin TR1 transmitting the data to the integrated circuit 24, controls the first display screen 11 to display the first portion of the electronic display, and the second display screen 21 to display the second portion of the electronic display.

Figure 4:
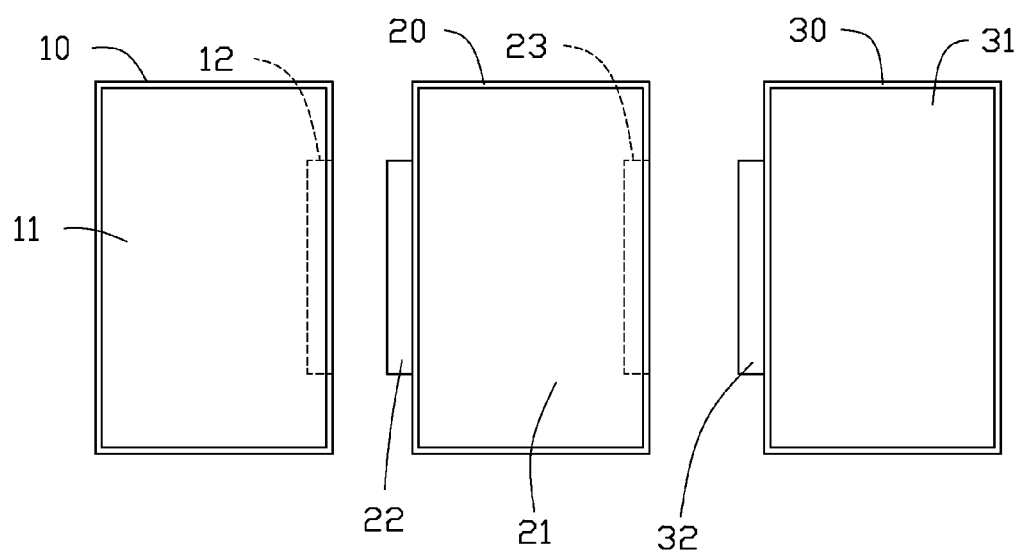
FIG. 4 is a diagrammatic view of a second embodiment of a framework for forming an electronic display.
Figure 5:
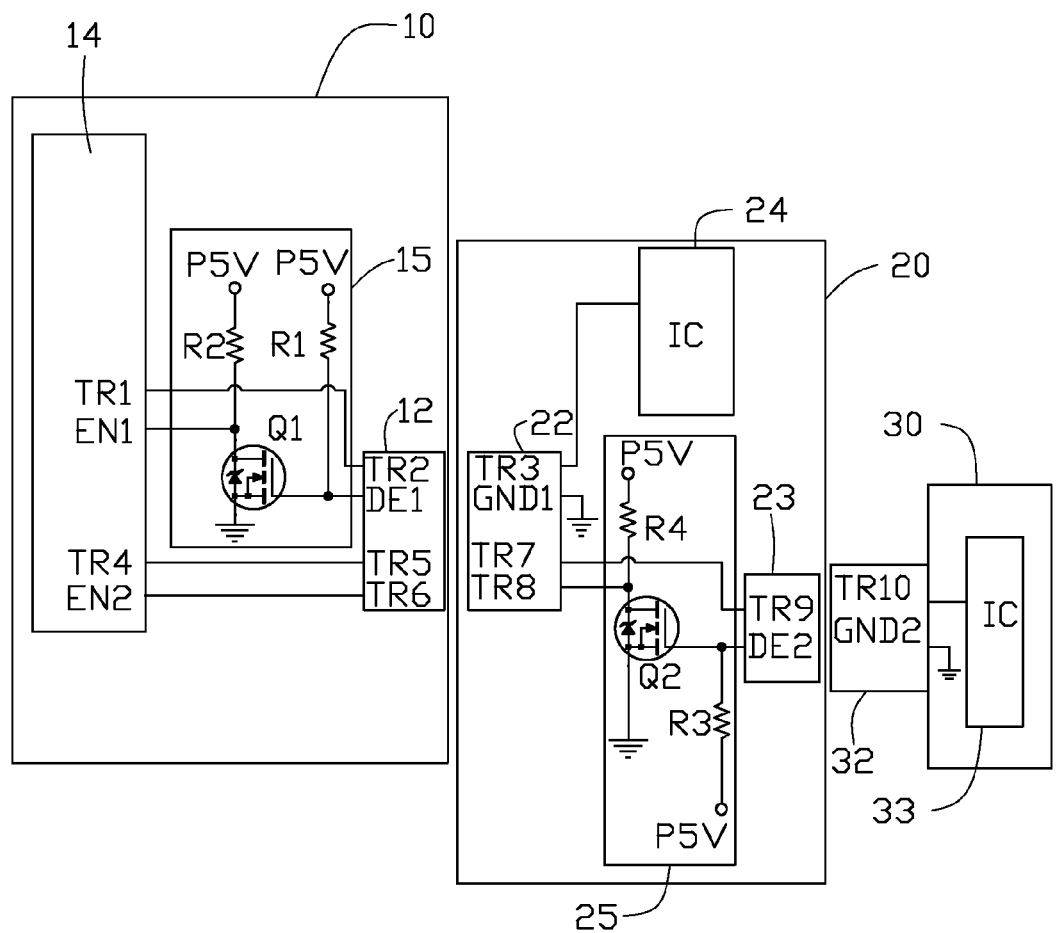
FIG. 5 is a circuit diagram of FIG. 4.
Figure 6:
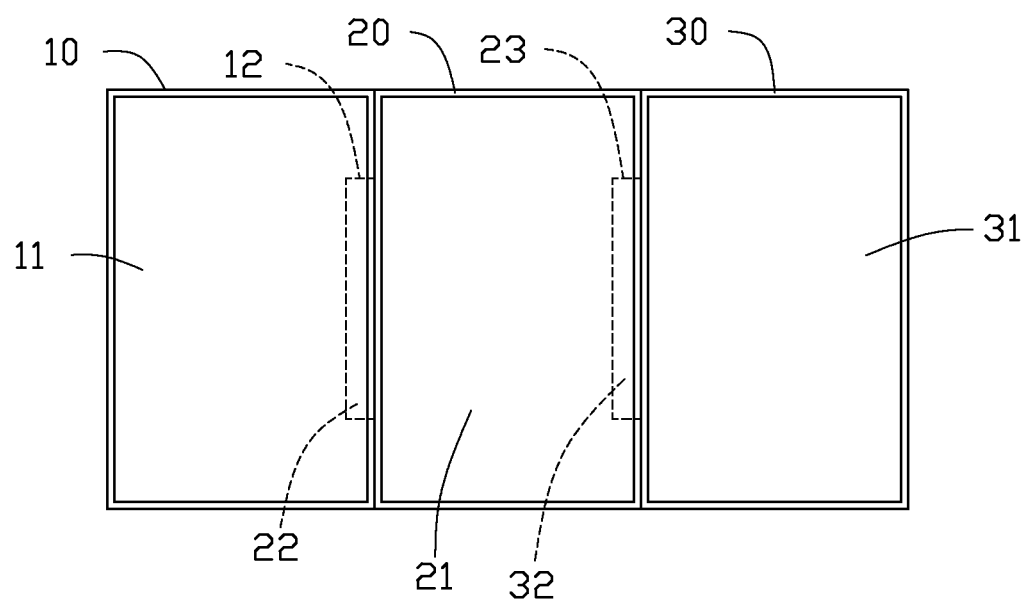
FIG. 6 is a diagrammatic view of a third embodiment of a framework for forming an electronic display.

FIGS. 4-6 illustrate a second embodiment of a framework for forming a composite electronic display. Referring to FIG. 4, the framework can include a first electronic device 10, a second electronic device 20, and a third electronic device 30. The first electronic device 10 can include a first display screen 11, the second electronic device 20 can include a second display screen 21, and the third electronic device 30 can include a third display screen 31. The first electronic device 10 can include a first connector 12, the second electronic device 20 can include a second connector 22 and a third connector 23, and the third electronic device 30 can include a fourth connector 32. The first electronic device 10 and the second electronic device 20 can be electronically coupled together by the first connector 12 electronically coupling to the second connector 22, and the second electronic device 20 and the third electronic device 30 can be electronically coupled together by the third connector 23 electronically coupling to the fourth connector 32. In the illustrated embodiment, the first connector 12 and the third connector 23 are female connectors, and the second connector 22 and the fourth connector 32 are male connectors. In another embodiment, the first connector 12 and the third connector 23 can be male connectors, and the second connector 22 and the fourth connector 32 can be female connectors. When the first electronic device 10, the second electronic device 20, and the third electronic device 30 are electronically coupled together, the first electronic device 10 can control the first display screen 11 to display a first portion of an electronic display, the second display screen 21 to display a second portion of the electronic display, and the third display screen 31 to display the third portion of the electronic display.

Referring to FIG. 5, the first electronic device 10 can include a system on a chip 14 electronically coupled to the first display screen 11 and include a first control module 15. The first connector 12 can be electronically coupled to the system on a chip 14 through the first control module 15. The second electronic device 20 can include a first integrated circuit 24 electronically coupled to the second display screen 21 and include a second control module 25. The second connector 22 can be electronically coupled to the third connector 23 through the second control module 25. The third electronic device 30 can further include a second integrated circuit 33 electronically coupled to the third display screen 31.

The system on a chip 14 can include a transmission pin TR1, an enabling pin EN1, a transmission pin TR4, and an enabling pin EN2. The first connector 12 can include a transmission pin TR2, a detection pin DE1, a transmission pin TR5, and a transmission pin TR6. The transmission pin TR1 and the enabling pin EN1 of the system on a chip 14 can be electronically coupled to the transmission pin TR2 and the detection pin DE1 of the first connector 12, respectively, through the first control module 15. The transmission pin TR4 and the enabling pin EN2 of the system on a chip 14 can be electronically coupled to the transmission pin TR5 and the transmission pin TR6 of the first connector 12, respectively. The second connector 22 can include a transmission pin TR3, a ground pin GND1, a transmission pin TR7, and a transmission pin TR8. The third connector 23 can include a transmission pin TR9 and a detection pin DE2. The transmission pin TR3 and the ground pin GND1 of the second connector 22 can be electronically coupled to the first integrated circuit 24 and ground, respectively. The transmission pin TR7 and the transmission pin TR8 of the second connector 22 can be electronically coupled to the transmission pin TR9 and the detection pin DE2 of the third connector 23, respectively, through the second control module 25. The fourth connector 32 can include a transmission pin TR10 and a ground pin GND2 electronically coupled to the second integrated circuit 33 and ground, respectively.

The first control module 15 can include an electronic switch Q1, a resistor R1, and a resistor R2. The electronic switch Q1 can include a first terminal, a second terminal, and a third terminal. The first terminal of the electronic switch Q1 can be electronically coupled to a power source P5V through the resistor R1 and electronically coupled to the detection pin DE1. The second terminal can be electronically coupled to the power source P5V through the resistor R2 and electronically coupled to the enabling pin EN1. The third terminal can be electronically coupled to ground.

The second control module 25 can include an electronic switch Q2, a resistor R3, and a resistor R4. The electronic switch Q2 can include a first terminal, a second terminal, and a third terminal. The first terminal of the electronic switch Q2 can be electronically coupled to the power source P5V through the resistor R3 and electronically coupled to the detection pin DE2. The second terminal can be electronically coupled to the power source P5V through the resistor R4 and electronically coupled to the transmission pin TR8. The third terminal can be electronically coupled to ground.

When the second electronic device 20 is electronically coupled to the first electronic device 10, the transmission pin TR2, the detection pin DE1, the transmission pin TR5, and the transmission pin TR6 of the first connector 12 are electronically coupled to the transmission pin TR3, the ground pin GND1, the transmission pin TR7, and the transmission pin TR8 of the second connector 22, respectively. When the third electronic device 30 is electronically coupled to the second electronic device 20, the transmission pin TR9 and the detection pin DE2 of the third connector 23 are electronically coupled to the transmission pin TR10 and the ground pin GND2 of the fourth connector 32, respectively.

The detection pin DE1 of the first connector 12 electronically coupled to the ground pin GND1 of the second connector 22 transmits a low-level voltage signal to the electronic switch Q1, thereby closing the electronic switch Q1. The closed electronic switch Q1 transmits a high-level voltage signal to the enabling pin EN1 of the system on a chip 14. The transmission pin TR1, upon the enabling pin EN1 receiving the high-level voltage signal, can transmit data to the first integrated circuit 24 of the second electronic device 20 through the transmission pin TR2 and the transmission pin TR3. Upon the transmission pin TR1 transmitting the data to the first integrated circuit 24, the system on a chip 14 can control the first display screen 11 to display the first portion of the electronic display, and control the second display screen 21 through the first integrated circuit 24 to display the second portion of the electronic display.

The detection pin DE2 of the third connector 23 electronically coupled to the ground pin GND2 of the fourth connector 32 transmits a low-level voltage signal to the electronic switch Q2, thereby closing the electronic switch Q2. The closed electronic switch Q2 transmits a high-level voltage signal to the enabling pin EN2 of the system on a chip 14 through the transmission pin TR8 and the transmission pin TR6. The transmission pin TR4, upon the enabling pin EN2 receiving the high-level voltage signal, can transmit data to the second integrated circuit 33 through the transmission pin TR5, the transmission pin TR7, the transmission pin TR9, and the transmission pin TR10. Upon the transmission pin TR4 transmitting the data to the second integrated circuit 33, the system on a chip 14 can control the third display screen 31 through the second integrated circuit 33 to display the third portion of the electronic display.

Figure 7:
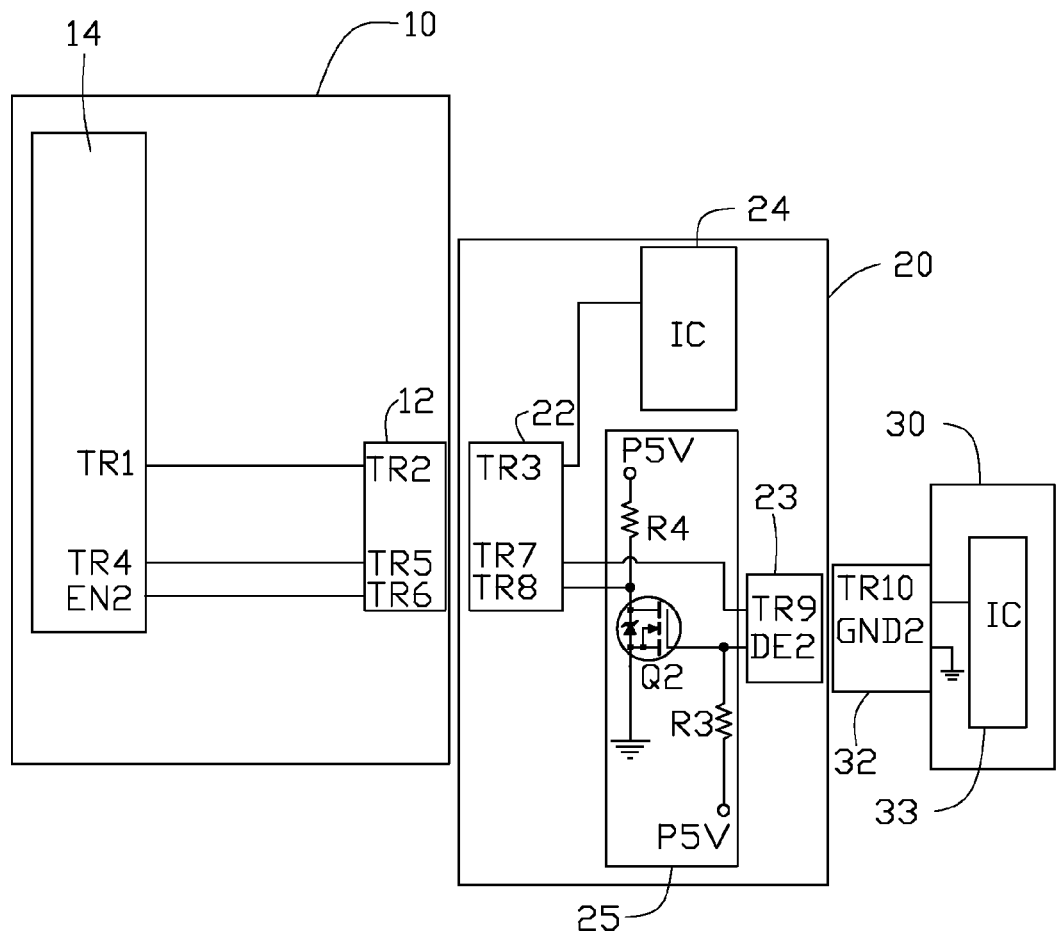
FIG. 7 is a circuit diagram of FIG. 6.

FIG. 6 and FIG. 7 illustrate a third embodiment of a framework for forming an electronic display. Referring to FIG. 6, the framework can include a first electronic device 10, a second electronic device 20, and a third electronic device 30. The first electronic device 10 can include a first display screen 11, the second electronic device 20 can include a second display screen 21, and the third electronic device 30 can include a third display screen 31. The first electronic device 10 can include a first connector 12, the second electronic device 20 can include a second connector 22 and a third connector 23, and the third electronic device 30 can include a fourth connector 32. The first electronic device 10 and the second electronic device 20 can be electronically coupled together by the first connector 12 electronically coupling to the second connector 22, and the second electronic device 20 and the third electronic device 30 can be electronically coupled together by the third connector 23 electronically coupling to the fourth connector 32. In the illustrated embodiment, the first connector 12 and the third connector 23 are female connectors, and the second connector 22 and the fourth connector 32 are male connectors. In another embodiment, the first connector 12 and the third connector 23 can be male connectors, and the second connector 22 and the fourth connector 32 can be female connectors. When the first electronic device 10, the second electronic device 20, and the third electronic device 30 are electronically coupled together, the system on a chip 14 can control the first display screen 11 to display a first portion of an electronic display, the second display screen 21 to display a second portion of the electronic display, and the third display screen 31 to display the third portion of the electronic display.

Referring to FIG. 7, the first electronic device 10 can further include a system on a chip 14 electronically coupled to the first display screen 11. The first connector 12 can be electronically coupled to the system on a chip 14. The second electronic device 20 can further include a first integrated circuit 24 electronically coupled to the second display screen 21 and include a control module 25. The second connector 22 can be electronically coupled to the third connector 23 through the control module 25. The third electronic device 30 can further include a second integrated circuit 33 electronically coupled to the third display screen 31.

The system on a chip 14 can include a transmission pin TR1, a transmission pin TR4, and an enabling pin EN2. The first connector 12 can include a transmission pin TR2, a transmission pin TR5, and a transmission pin TR6. The transmission pin TR1 of the system on a chip 14 can be electronically coupled to the transmission pin TR2 of the first connector 12. The transmission pin TR4 and the enabling pin EN2 of the system on a chip 14 can be electronically coupled to the transmission pin TR5 and the transmission pin TR6 of the first connector 12, respectively. The second connector 22 can include a transmission pin TR3, a transmission pin TR7, and a transmission pin TR8. The third connector 23 can include a transmission pin TR9 and a detection pin DE2. The transmission pin TR3 of the second connector 22 can be electronically coupled to the first integrated circuit 24. The transmission pin TR7 and the transmission pin TR8 of the second connector 22 can be electronically coupled to the transmission pin TR9 and the detection pin DE2 of the third connector 23, respectively, through the control module 25. The fourth connector 32 can include a transmission pin TR10 and a ground pin GND2 electronically coupled to the second integrated circuit 33 and ground, respectively.

The control module 25 can include an electronic switch Q2, a resistor R3, and a resistor R4. The electronic switch Q2 can include a first terminal, a second terminal, and a third terminal. The first terminal of the electronic switch Q2 can be electronically coupled to a power source P5V through the resistor R3 and electronically coupled to the detection pin DE2. The second terminal can be electronically coupled to the power source P5V through the resistor R4 and electronically coupled to the transmission pin TR8. The third terminal can be electronically coupled to ground.

When the second electronic device 20 is electronically coupled to the first electronic device 10, the transmission pin TR2, the transmission pin TR5, and the transmission pin TR6 of the first connector 12 are electronically coupled to the transmission pin TR3, the transmission pin TR7, and the transmission pin TR8 of the second connector 22, respectively. When the third electronic device 30 is electronically coupled to the second electronic device 20, the transmission pin TR9 and the detection pin DE2 of the third connector 23 are electronically coupled to the transmission pin TR10 and the ground pin GND2 of the fourth connector 32, respectively.

When the first electronic device 10, the second electronic device 20, and the third electronic device 30 are electronically coupled together, the detection pin DE2 of the third connector 23 electronically coupled to the ground pin GND2 of the fourth connector 32 transmits a low-level voltage signal to the electronic switch Q2, thereby closing the electronic switch Q2. The closed electronic switch Q2 transmits a high-level voltage signal to the enabling pin EN2 of the system on a chip 14 through the transmission pin TR8 and the transmission pin TR6. The transmission pin TR1, upon the enabling pin EN2 receiving the high-level voltage signal, can transmit data to the first integrated circuit 24 through the transmission pin TR2 and the transmission pin TR3. Upon the transmission pin TR1 transmitting the data to the first integrated circuit 24, the system on a chip 14 can control the first display screen 11 to display the first portion of the electronic display, and control the second display screen 21 to display the second portion of the electronic display. The transmission pin TR4, upon the enabling pin EN2 receiving the high-level voltage signal, can transmit data to the second integrated circuit 33 through the transmission pin TR5, the transmission pin TR7, the transmission pin TR9, and the transmission pin TR10. Upon the transmission pin TR4 transmitting the data to the second integrated circuit 33, the system on a chip 14 can control the third display screen 31 through the second integrated circuit 33 to display the third portion of the electronic display.

Figure 8:
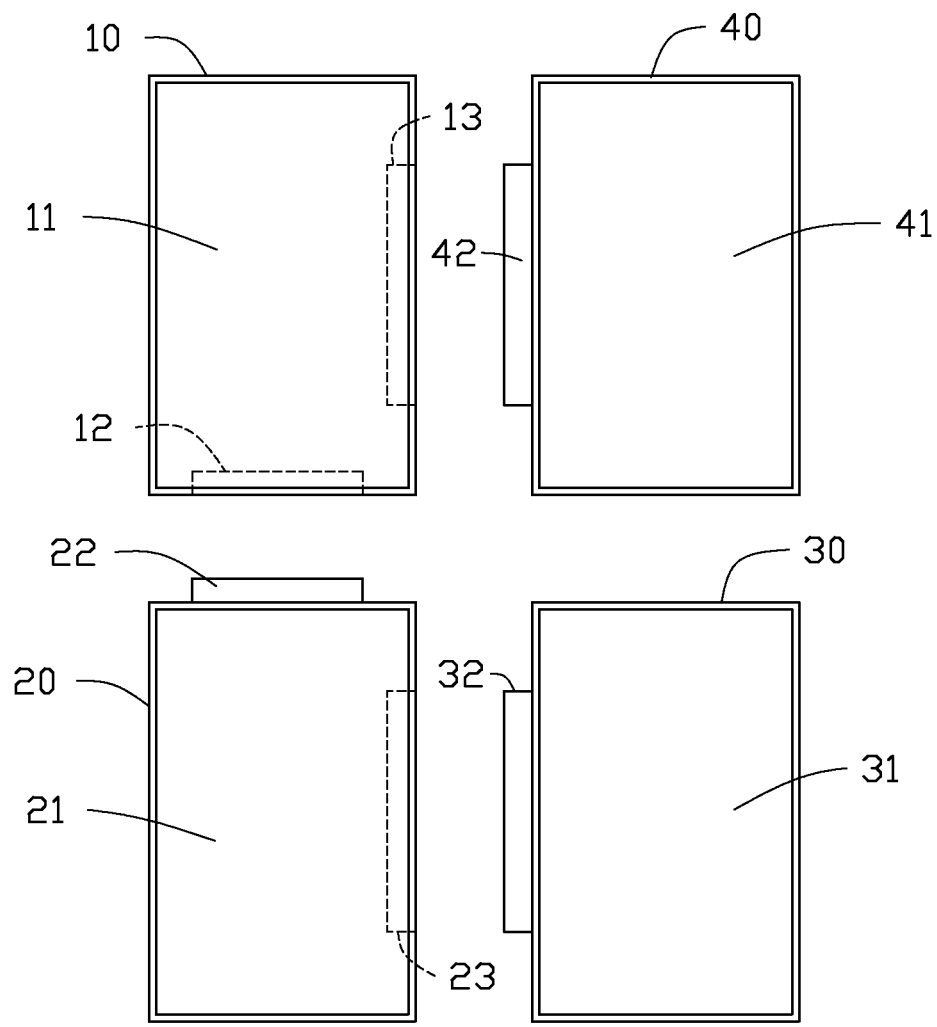
FIG. 8 is a diagrammatic view of a fourth embodiment of a framework for forming an electronic display.
Figure 9:
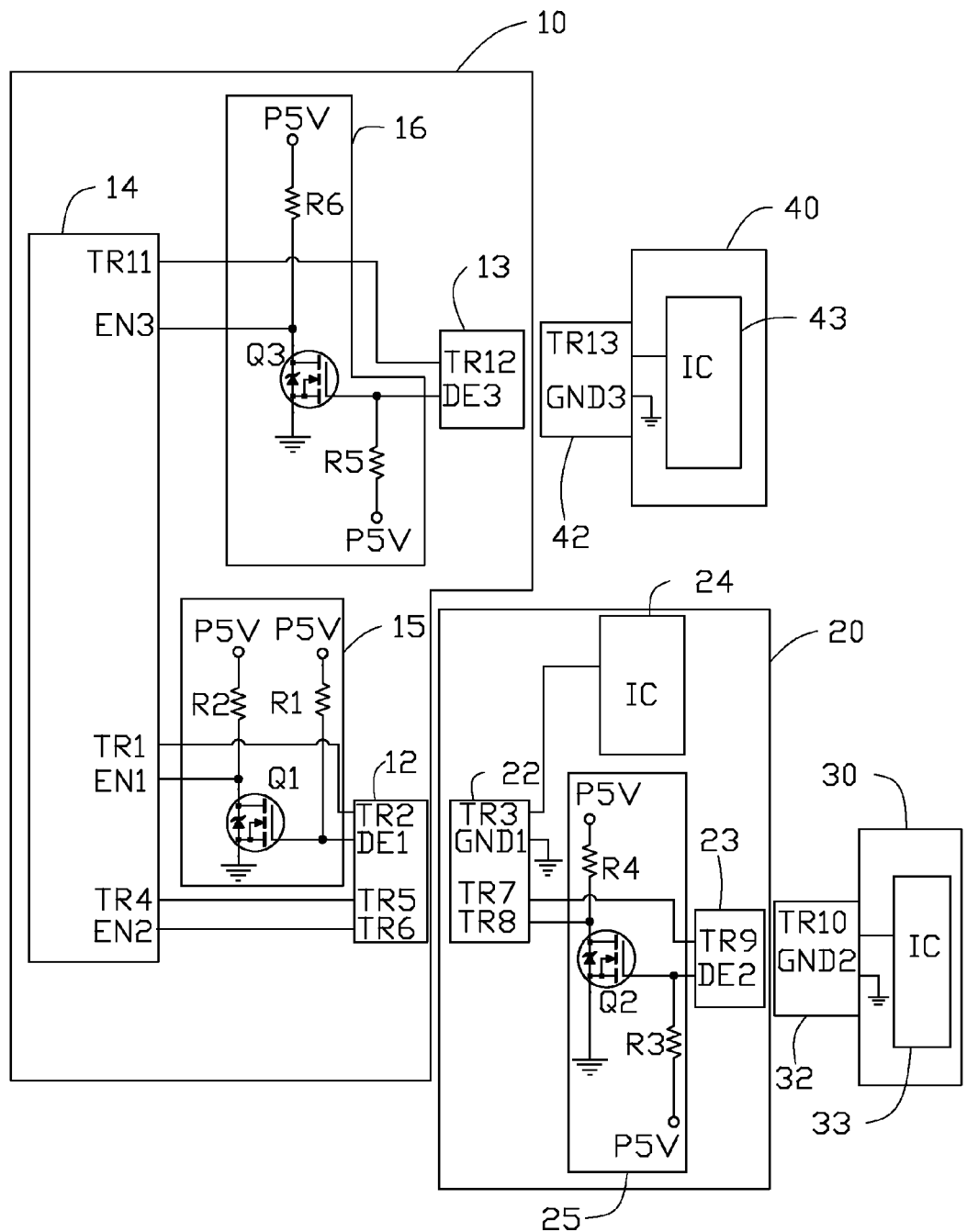
FIG. 9 is a circuit diagram of FIG. 8.

FIG. 8 and FIG. 9 illustrate a fourth embodiment of a framework for forming an electronic display. Referring to FIG. 8, the framework can include a plurality of electronic devices, such as a primary electronic device 10, at least one coupling electronic device 20, and at least one secondary electronic device. The primary electronic device 10, the at least one coupling electronic device 20, and the at least one secondary electronic device each can include a display screen and at least one connector, the at least one connector being used to electronically couple to the at least one connector of another electronic device. In the illustrated embodiment, there is one coupling electronic device 20, a first secondary electronic device 40, and a second secondary electronic device 30. The primary electronic device 10 can include a display screen 11, a first primary connector 13 and a second primary connector 12. The coupling electronic device 20 can include a display screen 21, a first coupling connector 22 and a second coupling connector 23. The first secondary electronic device 40 can include a display screen 41 and a connector 42, and the second secondary electronic device 30 can include a display screen 31 and a connector 32. In the illustrated embodiment, the first primary connector 13, the second primary connector 12, and the second coupling connector 23 are female connectors, and the first coupling connector 22 and the connectors 42, 32 of the secondary electronic devices 40, 30 are male connectors. In another embodiment, the first primary connector 13, the second primary connector 12, and the second coupling connector 23 can be male connectors, and the first coupling connector 22 and the connectors 42, 32 of the secondary electronic devices 40, 30 can be female connectors. The first secondary electronic device 40 can be electronically coupled to the primary electronic device 10 directly, and the second secondary electronic device 30 can be electronically coupled to the primary electronic device 10 through the coupling electronic device 20. When the primary electronic device 10, the coupling electronic device 20, and the secondary electronic devices 40, 30 are electronically coupled together, the primary electronic device 10 can control the display screens 11, 21, 41, 31 of the primary electronic device 10, the coupling electronic device 20, and the secondary electronic devices 40, 30 to display corresponding portions of an electronic display.

Referring to FIG. 9, the primary electronic device 10 can include a system on a chip 14 electronically coupled to the display screen 11 of the primary electronic device 10 and include a first primary control module 16 and a second primary control module 15. The system on a chip 14 can be electronically coupled to the first primary connector 13 through the first primary control module 16 and be electronically coupled to the second primary connector 12 through the second primary control module 15. The coupling electronic device 20 can include an integrated circuit 24 electronically coupled to the display screen 21 of the coupling electronic device 20 and include a coupling control module 25. The first coupling connector 22 can be electronically coupled to the second coupling connector 23 through the coupling control module 25. The first secondary electronic device 40 can include an integrated circuit 43 electronically coupled to the display screen 41 of the first secondary electronic device 40, and the second secondary electronic device 30 can include an integrated circuit 30 electronically coupled to the display screen 31 of the second secondary electronic device 30.

The system on a chip 14 can include a transmission pin TR11, an enabling pin EN3, a transmission pin TR1, an enabling pin EN1, a transmission pin TR4, and an enabling pin EN2. The first primary connector 13 can include a transmission pin TR12 and a detection pin DE3. The second primary connector 12 can include a transmission pin TR2, a detection pin DE1, a transmission pin TR5, and a transmission pin TR6. The first coupling connector 22 can include a transmission pin TR3, a ground pin GND1, a transmission pin TR7, and a transmission pin TR8. The second coupling connector 23 can include a transmission pin TR9 and a detection pin DE2. The connector 42 of the first secondary electronic device 40 can include a transmission pin TR13 and a ground pin GND3. The connector 32 of the second secondary electronic device 30 can include a transmission pin TR10 and a ground pin GND2.

The first primary control module 16 can include an electronic switch Q3, a resistor R5, and a resistor R6. The electronic switch Q3 can include a first terminal, a second terminal, and a third terminal. The first terminal can be electronically coupled to a power source P5V through the resistor R5 and electronically coupled to the detection pin DE3. The second terminal can be electronically coupled to the power source P5V through the resistor R6, and electronically coupled to the enabling pin EN3. The third terminal can be electronically coupled to ground. The transmission pin TR11 and the enabling pin EN3 of the system on a chip 14 can be electronically coupled to the transmission pin TR12 and the detection pin DE3 of the first primary connector 13, respectively.

The second primary control module 15 can include an electronic switch Q1, a resistor R1, and a resistor R2. The electronic switch Q1 can include a first terminal, a second terminal, and a third terminal. The first terminal can be electronically coupled to the power source P5V through the resistor R1 and electronically coupled to the detection pin DE1. The second terminal can be electronically coupled to the power source P5V through the resistor R2 and electronically coupled to the enabling pin EN1. The third terminal can be electronically coupled to ground. The transmission pin TR1, the enabling pin EN1, the transmission pin TR4, and the enabling pin EN2 of the system on a chip 14 can be electronically coupled to the transmission pin TR2, the detection pin DE1, the transmission pin TR5, and the transmission pin TR6 of the second primary connector 12, respectively.

The coupling control module 25 can include an electronic switch Q2, a resistor R3, and a resistor R4. The electronic switch Q2 can include a first terminal, a second terminal, and a third terminal. The first terminal can be electronically coupled to the power source P5V through the resistor R3 and electronically coupled to the detection pin DE2. The second terminal can be electronically coupled to the power source P5V through the resistor R4 and electronically coupled to the transmission pin TR8. The third terminal can be electronically coupled to ground. The transmission pin TR3 can be electronically coupled to the integrated circuit 24 of the coupling electronic device 20, and the ground pin GND1 can be electronically coupled to ground. The transmission pin TR7 and the transmission pin TR8 of the first coupling connector 22 can be electronically coupled to the transmission pin TR9 and the detection pin DE2 of the second coupling connector 23, respectively.

The transmission pin TR13 of the connector 42 of the first secondary electronic device 40 can be electronically coupled to the integrated circuit 43 of the first secondary electronic device 40, and the ground pin GND3 of the connector 42 of the first secondary electronic device 40 can be electronically coupled to ground. The transmission pin TR10 of the connector 32 of the second secondary electronic device 30 can be electronically coupled to the integrated circuit 33 of the second secondary electronic device 30, and the ground pin GND2 of the connector 32 of the second secondary electronic device 30 can be electronically coupled to ground.

When the first secondary electronic device 40 is electronically coupled to the primary electronic device 10, the transmission pin TR12 and the detection pin DE3 of the first primary connector 13 are electronically coupled to the transmission pin TR13 and the ground pin GND3 of the connector 42 of the first secondary electronic device 40, respectively. The detection pin DE3 of the first primary connector 13 electronically coupled to the ground pin GND3 of the connector 42 of the first secondary electronic device 40 transmits a low-level voltage signal to the electronic switch Q3, thereby closing the electronic switch Q3. The closed electronic switch Q3 transmits a high-level voltage signal to the enabling pin EN3 of the system on a chip 14. The transmission pin TR11, upon the enabling pin EN3 receiving the high-level voltage signal, can transmit data to the integrated circuit 43 of the first secondary electronic device 40 through the transmission pin TR12 and the transmission pin TR13. Upon the transmission pin TR11 transmitting the data to the integrated circuit 43 of the first secondary electronic device 40, the system on a chip 14 can control the display screen 41 of the first secondary electronic device 40 through the integrated circuit 43 of the first secondary electronic device 40 to display the corresponding portion of the electronic display.

When the coupling electronic device 20 is electronically coupled to the primary electronic device 10, the transmission pin TR2, the detection pin DE1, the transmission pin TR5, and the transmission pin TR6 of the second primary connector 12 are electronically coupled to the transmission pin TR3, the ground pin GND1, the transmission pin TR7, and the transmission pin TR8 of the first coupling connector 22, respectively. The detection pin DE1 of the second primary connector 12 electronically coupled to the ground pin GND1 of the first coupling connector 22 transmits a low-level voltage signal to the electronic switch Q1, thereby closing the electronic switch Q1. The closed electronic switch Q1 transmits a high-level voltage signal to the enabling pin EN1 of the system on a chip 14. The transmission pin TR1, upon the enabling pin EN1 receiving the high-level voltage signal, can transmit data to the integrated circuit 24 of the coupling electronic device 20 through the transmission pin TR2 and the transmission pin TR3. Upon the transmission pin TR1 transmitting the data to the integrated circuit 24 of the coupling electronic device 20, the system on a chip 14 can control the display screen 21 of the coupling electronic device 20 through the integrated circuit 24 of the coupling electronic device 20 to display the corresponding portion of the electronic display.

When the second secondary electronic device 30 is electronically coupled to the coupling electronic device 20, the transmission pin TR9 and the detection pin DE2 of the second coupling connector 23 are electronically coupled to the transmission pin TR10 and the ground pin GND2 of the connector 32 of the second secondary electronic device 30, respectively. The detection pin DE2 of the second coupling connector 23 electronically coupled to the ground pin GND2 of the connector 32 of the second secondary electronic device 30 transmits a low-level voltage signal to the electronic switch Q2, thereby closing the electronic switch Q2. The closed electronic switch Q2 transmits a high-level voltage signal to the enabling pin EN2 of the system on a chip 14 through the transmission pin TR8 and the transmission pin TR6. The transmission pin TR4, upon the enabling pin EN2 receiving the high-level voltage signal, can transmit data to the integrated circuit 33 of the second secondary electronic device 30 through the transmission pin TR5, the transmission pin TR7, the transmission pin TR9, and the transmission pin TR10. Upon the transmission pin TR4 transmitting the data to the integrated circuit 33 of the second secondary electronic device 30, the system on a chip 14 can control the display screen 31 of the second secondary electronic device 30 through the integrated circuit 33 of the second secondary electronic device 30 to display the corresponding portion of the electronic display.

Figure 10:
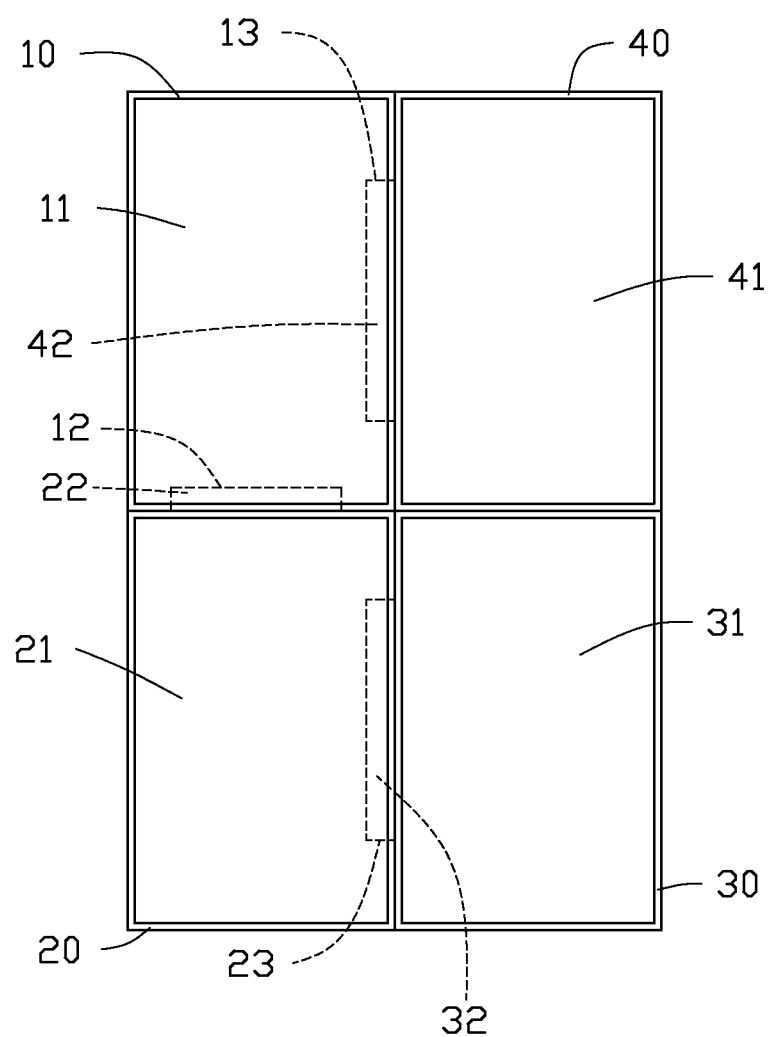
FIG. 10 is a diagrammatic view of a fifth embodiment of a framework for forming an electronic display.
Figure 11:
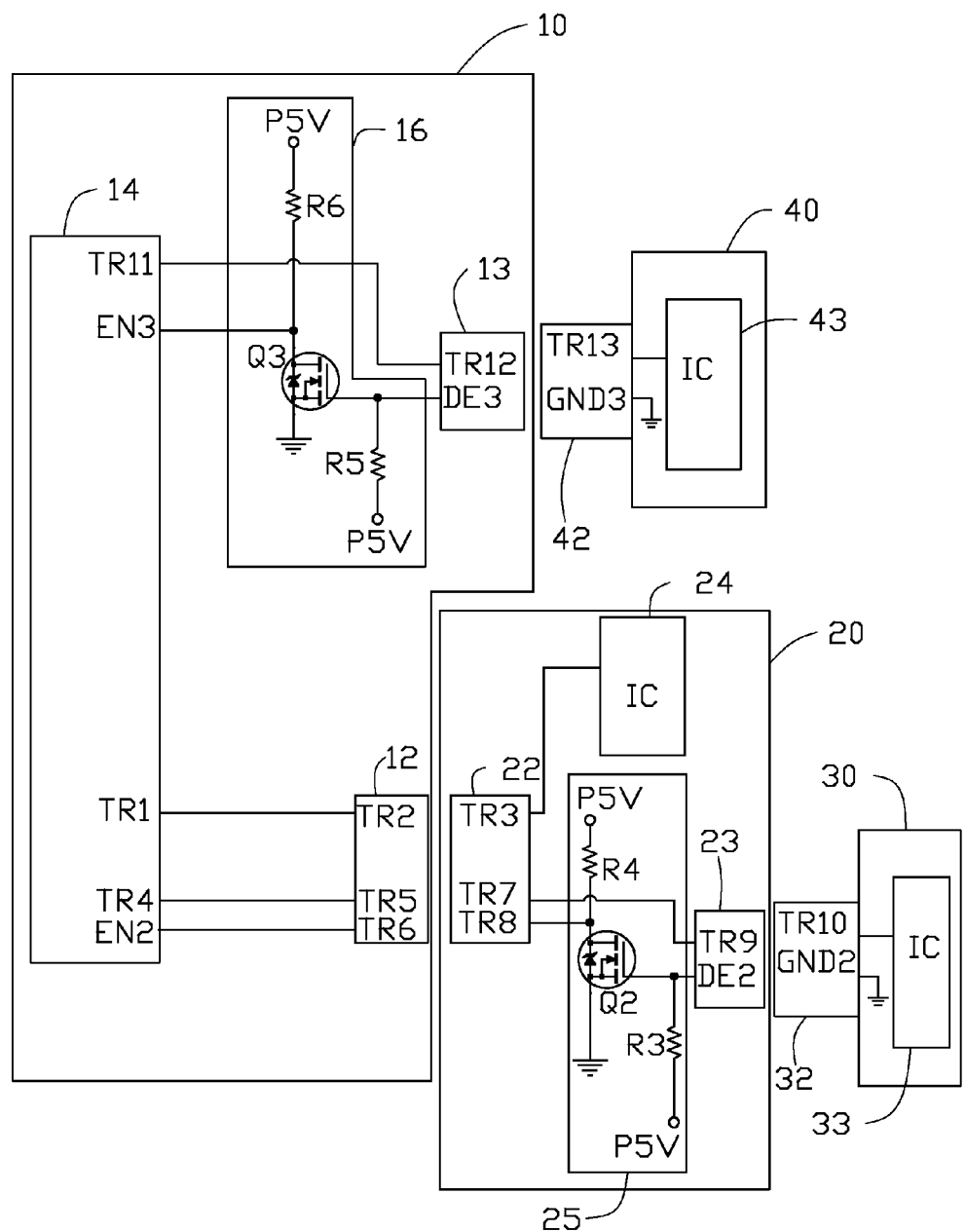
FIG. 11 is a circuit diagram of FIG. 10.

FIG. 10 and FIG. 11 illustrate a fifth embodiment of a framework for forming an electronic display. Referring to FIG. 8, the framework can include a plurality of electronic devices, such as a primary electronic device 10, at least one coupling electronic device 20, and at least one secondary electronic device. The primary electronic device 10, the at least one coupling electronic device 20, and the at least one secondary electronic device each can include a display screen and at least one connector, the at least one connector being used to electronically couple to the at least one connector of another electronic device. In the illustrated embodiment, there is one coupling electronic device 20, a first secondary electronic device 40, and a second secondary electronic device 30. The primary electronic device 10 can include a display screen 11, a first primary connector 13 and a second primary connector 12. The coupling electronic device 20 can include a display screen 21, a first coupling connector 22 and a second coupling connector 23. The first secondary electronic device 40 can include a display screen 41 and a connector 42, and the second secondary electronic device 30 can include a display screen 31 and a connector 32. In the illustrated embodiment, the first primary connector 13, the second primary connector 12, and the second coupling connector 23 are female connectors, and the first coupling connector 22 and the connectors 42, 32 of the secondary electronic devices 40, 30 are male connectors. In another embodiment, the first primary connector 13, the second primary connector 12, and the second coupling connector 23 can be male connectors, and the first coupling connector 22 and the connectors 42, 32 of the secondary electronic devices 40, 30 can be female connectors. The first secondary electronic device 40 can be electronically coupled to the primary electronic device 10 directly, and the second secondary electronic device 30 can be electronically coupled to the primary electronic device 10 through the coupling electronic device 20. When the primary electronic device 10, the coupling electronic device 20, and the secondary electronic devices 40, 30 are electronically coupled together, the primary electronic device 10 can control the display screens 11, 21, 41, 31 of the primary electronic device 10, the coupling electronic device 20, and the secondary electronic devices 40, 30 to display corresponding portions of an electronic display.

Referring to FIG. 11, the primary electronic device 10 can include a system on a chip 14 electronically coupled to the display screen 11 of the primary electronic device 10 and include a primary control module 16. The system on a chip 14 can be electronically coupled to the first primary connector 13 through the primary control module 16. The coupling electronic device 20 can include an integrated circuit 24 electronically coupled to the display screen 21 of the coupling electronic device 20 and include a coupling control module 25. The first coupling connector 22 can be electronically coupled to the second coupling connector 23 through the coupling control module 25. The first secondary electronic device 40 can include an integrated circuit 43 electronically coupled to the display screen 41 of the first secondary electronic device 40, and the second secondary electronic device 30 can include an integrated circuit 33 electronically coupled to the display screen 31 of the second secondary electronic device 30.

The system on a chip 14 can include a transmission pin TR11, an enabling pin EN3, a transmission pin TR1, a transmission pin TR4, and an enabling pin EN2. The first primary connector 13 can include a transmission pin TR12 and a detection pin DE3. The second primary connector 12 can include a transmission pin TR2, a transmission pin TR5, and a transmission pin TR6. The first coupling connector 22 can include a transmission pin TR3, a transmission pin TR7, and a transmission pin TR8. The second coupling connector 23 can include a transmission pin TR9 and a detection pin DE2. The connector 42 of the first secondary electronic device 40 can include a transmission pin TR13 and a ground pin GND3. The connector 32 of the second secondary electronic device 30 can include a transmission pin TR10 and a ground pin GND2.

The primary control module 16 can include an electronic switch Q3, a resistor R5, and a resistor R6. The electronic switch Q3 can include a first terminal, a second terminal, and a third terminal. The first terminal can be electronically coupled to a power source P5V through the resistor R5 and electronically coupled to the detection pin DE3. The second terminal can be electronically coupled to the power source P5V thorough the resistor R6 and electronically coupled to the enabling pin EN3. The third terminal can be electronically coupled to ground. The transmission pin TR11 and the enabling pin EN3 of the system on a chip 14 can be electronically coupled to the transmission pin TR12 and the detection pin DE3 of the first primary connector 13, respectively.

The coupling control module 25 can include an electronic switch Q2, a resistor R3, and a resistor R4. The electronic switch Q2 can include a first terminal, a second terminal, and a third terminal. The first terminal can be electronically coupled to the power source P5V through the resistor R3 and electronically coupled to the detection pin DE2. The second terminal can be electronically coupled to the power source P5V thorough the resistor R4 and electronically coupled to the transmission pin TR8. The third terminal can be electronically coupled to ground. The transmission pin TR3 can be electronically coupled to the integrated circuit 24 of the coupling electronic device 20. The transmission pin TR7 and the transmission pin TR8 of the first coupling connector 22 can be electronically coupled to the transmission pin TR9 and the detection pin DE2 of the second coupling connector 23, respectively.

The transmission pin TR13 of the connector 42 of the first secondary electronic device 40 can be electronically coupled to the integrated circuit 43 of the first secondary electronic device 40, and the ground pin GND3 of the connector 42 of the first secondary electronic device 40 can be electronically coupled to ground. The transmission pin TR10 of the connector 32 of the second secondary electronic device 30 can be electronically coupled to the integrated circuit 33 of the second secondary electronic device 30, and the ground pin GND2 of the connector 32 of the second secondary electronic device 30 can be electronically coupled to ground.

When the first secondary electronic device 40 is electronically coupled to the primary electronic device 10, the transmission pin TR12 and the detection pin DE3 of the first primary connector 13 are electronically coupled to the transmission pin TR13 and the ground pin GND3 of the connector 42 of the first secondary electronic device 40, respectively. The detection pin DE3 of the first primary connector 13 electronically coupled to the ground pin GND3 of the connector 42 of the first secondary electronic device 40 transmits a low-level voltage signal to the electronic switch Q3, thereby closing the electronic switch Q3. The closed electronic switch Q3 transmits a high-level voltage signal to the enabling pin EN3 of the system on a chip 14. The transmission pin TR11, upon the enabling pin EN3 receiving the high-level voltage signal, can transmit data to the integrated circuit 43 of the first secondary electronic device 40 through the transmission pin TR12 and the transmission pin TR13. Upon the transmission pin TR11 transmitting the data to the integrated circuit 43 of the first secondary electronic device 40, the system on a chip 14 can control the display screen 41 of the first secondary electronic device 40 to display the corresponding portion of the electronic display.

When the coupling electronic device 20 is electronically coupled to the primary electronic device 10, the transmission pin TR2, the transmission pin TR5, and the transmission pin TR6 of the second primary connector 12 are electronically coupled to the transmission pin TR3, the transmission pin TR7, and the transmission pin TR8 of the first coupling connector 22, respectively.

When the second secondary electronic device 30 is electronically coupled to the coupling electronic device 20, the transmission pin TR9 and the detection pin DE2 of the second coupling connector 23 are electronically coupled to the transmission pin TR10 and the ground pin GND2 of the connector 32 of the second secondary electronic device 30, respectively. The detection pin DE2 of the second coupling connector 23 electronically coupled to the ground pin GND2 of the connector 32 of the second secondary electronic device 30 transmits a low-level voltage signal to the electronic switch Q2, thereby closing the electronic switch Q2. The closed electronic switch Q2 transmits a high-level voltage signal to the enabling pin EN2 of the system on a chip 14 through the transmission pin TR8 and the transmission pin TR6. The transmission pin TR1, upon the enabling pin EN2 receiving the high-level voltage signal, can transmit data to the integrated circuit 24 of the coupling electronic device 20 through the transmission pin TR2 and the transmission pin TR3. Upon the transmission pin TR1 transmitting the data to the integrated circuit 24 of the coupling electronic device 20, the system on a chip 14 can control the display screen 21 of the coupling electronic device 20 through the integrated circuit 24 of the coupling electronic device 20 to display the corresponding portion of the electronic display. The transmission pin TR4, upon the enabling pin EN2 receiving the high-level voltage signal, can transmit data to the integrated circuit 33 of the second secondary electronic device 30 through the transmission pin TR5, the transmission pin TR7, the transmission pin TR9, and the transmission pin TR10. Upon the transmission pin TR4 transmitting the data to the integrated circuit 33 of the second secondary electronic device 30, the system on a chip 14 can control the display screen 31 of the second secondary electronic device 30 through the integrated circuit 33 of the second secondary electronic device 30 to display the corresponding portion of the electronic display.

The electronic switches of the first through fifth embodiments can be NMOS field effect transistors, and the first terminals, the second terminals, and the third terminals can be gate electrodes, source electrodes, and drain electrodes.

In other embodiments, the electronic switches can be NPN-type transistors or other suitable type of transistor.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A framework for forming a composite electronic display, the framework comprising:
   a first electronic device comprising a first display screen; and
   a second electronic device comprising a second display screen;
   wherein the first display screen and the second display screen cooperatively form an electronic display when the second electronic device is electronically coupled to the first electronic device;
   the first electronic device further comprises a system on a chip electronically coupled to the first display screen and comprises a control module;
   the second electronic device comprises an integrated circuit electronically coupled to the second display screen;
   the control module transmits a high-level voltage signal to the system on a chip when the second electronic device is electronically coupled to the first electronic device; and
   when the system on a chip receives the high-level voltage signal from the control module, the system on a chip controls the first display screen to display a first portion of an electronic display, and controls the second display screen to display a second portion of the electronic display.

2. The framework as in claim 1, wherein:
   the first electronic device comprises a first connector;
   the second electronic device comprises a second connector; and
   the second electronic device is electronically coupled to the first electronic device by the second connector electronically coupling to the first connector.

3. The framework as in claim 1, wherein:
   the system on a chip comprises an enabling pin and a first transmission pin;
   the control module comprises an electronic switch, a first resistor, and a second resistor;
   the electronic switch is configured to transmit the high-level voltage signal to the system on a chip;
   the electronic switch comprises a first terminal, a second terminal, and a third terminal;
   the first connector comprises a detection pin and a second transmission pin;
   the second connector comprises a ground pin and a third transmission pin;
   the first transmission pin is electronically coupled to the second transmission pin, and the third transmission pin is electronically coupled to the integrated circuit;
   the first terminal of the electronic switch is electronically coupled to a power source through the first resistor of the control module, and also electronically coupled to the detection pin of the first connector;
   the second terminal of the electronic switch is electronically coupled to a power source through the second resistor of the control module, and also electronically coupled to the enabling pin of the system on a chip;
   the third terminal of the electronic switch is electronically coupled to ground;
   when the second connector is electronically coupled to the first connector, the detection pin and the second transmission pin of the first connector are electronically coupled to the ground pin and the third transmission pin of the second connector, respectively;
   the detection pin electronically coupled to the ground pin transmits a low-level voltage signal to the electronic switch, thereby closing the electronic switch;
   the closed electronic switch transmits the high-level voltage signal to the enabling pin of the system on a chip;
   the first transmission pin, upon the enabling pin receiving the high-level voltage signal, transmits data to the integrated circuit of the second electronic device through the second transmission pin and the third transmission pin; and
   upon the integrated circuit receiving the data from the first transmission pin, the system on a chip controls the second display screen through the integrated circuit to display the second portion of the electronic display.

4. A framework for forming an electronic display, the framework comprising:
   a first electronic device comprising a first display screen and a system on a chip electronically coupled to the first display screen;
   a second electronic device comprising a second display screen and a first integrated circuit electronically coupled to the second display screen; and
   a third electronic device comprising a third display screen and a second integrated circuit electronically coupled to the third display screen;
   wherein the first, second, and third display screens cooperatively form an electronic display when the first, second, and third electronic devices are electronically coupled together;
   the second electronic device comprises a control module;
   the control module transmits a high-level voltage signal to the system on a chip when the first, second, and third electronic devices are electronically coupled together; and
   when the system on a chip receives the high-level voltage signal from the control module, the system on a chip controls the first display screen to display a first portion of an electronic display, the second display screen to display a second portion of the electronic display, and the third display screen to display a third portion of the electronic display.

5. The framework as in claim 4, wherein:
   the first electronic device comprises a first connector;
   the second electronic device comprises a second connector and a third connector;
   the third electronic device comprises a fourth connector;
   the first electronic device is electronically coupled to the second electronic device by the first connector electronically coupling to the second connector; and
   the second electronic device is electronically coupled to the third electronic device by the third connector electronically coupling to the fourth connector.

6. The framework as in claim 5, wherein:
the first electronic device comprises a first control module;
the second electronic device comprises a second control module;
the first control module transmits a high-level voltage signal to the system on a chip when the second electronic device is electronically coupled to the first electronic device;
the second control module transmits a high-level voltage signal to the system on a chip when the third electronic device is electronically coupled to the second electronic device; and
when the system on a chip receives the high-level voltage signal from the first control module and the second control module, the system on a chip controls the first display screen to display a first portion of an electronic display, the second display screen to display a second portion of the electronic display, and the third display screen to display a third portion of the electronic display.

7. The framework as in claim 6, wherein:
the system on a chip comprises a first enabling pin, a second enabling pin, a first transmission pin, and a second transmission pin;
the first control module comprises a first electronic switch, a first resistor, and a second resistor;
the first electronic switch is configured to transmit the high-level voltage signal to the system on a chip;
the first electronic switch comprises a first terminal, a second terminal, and a third terminal;
the first connector comprises a first detection pin, a third transmission pin, a fourth transmission pin, and a fifth transmission pin;
the second connector comprises a first ground pin, a sixth transmission pin, a seventh transmission pin, and an eighth transmission pin;
the sixth transmission pin and the first ground pin are electronically coupled to the first integrated circuit and to ground, respectively;
the second control module comprises a second electronic switch, a third resistor, and a fourth resistor;
the second control module is configured to transmit the high-level voltage signal to the system on a chip;
the second electronic switch comprises a first terminal, a second terminal, and a third terminal;
the third connector comprises a ninth transmission pin and a second detection pin;
the fourth connector comprises a tenth transmission pin and a second ground pin;
the first transmission pin and the first enabling pin are electronically coupled to the third transmission pin and the first detection pin, respectively, through the first control module;
the second transmission pin and the second enabling pin are electronically coupled to the fourth transmission pin and the fifth transmission pin;
the first terminal of the first electronic switch is electronically coupled to a power source through the first resistor of the first control module, and also electronically coupled to the first detection pin of the first connector;
the second terminal of the electronic switch is electronically coupled to a power source through the second resistor of the first control module, and also electronically coupled to the first enabling pin of the system on a chip;
the third terminal of the first electronic switch is electronically coupled to ground;
when the second connector is electronically coupled to the first connector, the first detection pin and the third transmission pin of the first connector are electronically coupled to the first ground pin and the sixth transmission pin of the second connector, respectively;
the first detection pin electronically coupled to the first ground pin transmits a low-level voltage signal to the first electronic switch, thereby closing the first electronic switch;
the closed first electronic switch transmits the high-level voltage signal to the first enabling pin of the system on a chip;
the first transmission pin, upon the first enabling pin receiving the high-level voltage signal, transmits data to the first integrated circuit of the second electronic device through the third transmission pin and the sixth transmission pin;
upon the first integrated circuit receiving the data from the first transmission pin, the system on a chip controls the second display screen through the first integrated circuit to display the second portion of the electronic display;
the first terminal of the second electronic switch is electronically coupled to a power source through the third resistor, and also electronically coupled to the second detection pin of the third connector;
the second terminal of the second electronic switch is electronically coupled to a power source through the fourth resistor, and also electronically coupled to the eighth transmission pin of the second connector;
the third terminal of the second electronic switch is electronically coupled to ground;
the seventh transmission pin and the eighth transmission pin are electronically coupled to the ninth transmission pin and the second detection pin, respectively, through the second control module;
the tenth transmission pin is electronically coupled to the second integrated circuit, and the second ground pin is electronically coupled to ground;
when the second connector is electronically coupled to the first connector, the fourth transmission pin and the fifth transmission pin of the first connector are electronically coupled to the seventh transmission pin and the eighth transmission pin of the second connector;
when the fourth connector is electronically coupled to the third connector, the second detection pin and the ninth transmission pin of the third connector are electronically coupled to the second ground pin and the tenth transmission pin of the fourth connector, respectively;
the second detection pin electronically coupled to the second ground pin transmits a low-level voltage signal to the second electronic switch, thereby closing the second electronic switch;
the closed second electronic switch transmits the high-level voltage signal to the second enabling pin of the system on a chip through the eighth transmission pin and the fifth transmission pin;
the second transmission pin, upon the second enabling pin receiving the high-level voltage signal, transmits data to the second integrated circuit of the third electronic device through the fourth transmission pin, the seventh transmission pin, the ninth transmission pin, and the tenth transmission pin; and
upon the second integrated circuit receiving the data from the second transmission pin, the system on a chip controls the third display screen through the second integrated circuit to display the third portion of the electronic display.

8. The framework as in claim 4, wherein:

the system on a chip comprises an enabling pin, a first transmission pin, and a second transmission pin;

the first connector comprises a third transmission pin, a fourth transmission pin, and a fifth transmission pin;

the second connector comprises a sixth transmission pin, a seventh transmission pin, and an eighth transmission pin;

the third connector comprises a ninth transmission pin and a detection pin;

the fourth connector comprises a tenth transmission pin and a ground pin;

the first transmission pin is electronically coupled to the third transmission pin;

the second transmission pin is electronically coupled to the fourth transmission pin;

the enabling pin is electronically coupled to the fifth transmission pin;

the sixth transmission pin is electronically coupled to the first integrated circuit;

the third, fourth, and fifth transmission pins of the first connector are electronically coupled to the sixth, seventh, and eighth transmission pins of the second connector, respectively, when the second connector is electronically coupled to the first connector;

the seventh transmission pin and the eighth transmission pin are electronically coupled to the ninth transmission pin and the detection pin, respectively, through the control module;

the control module comprises an electronic switch, a first resistor, and a second resistor;

the electronic switch is configured to transmit the high-level voltage signal to the system on a chip;

the electronic switch comprises a first terminal, a second terminal, and a third terminal;

the first terminal is electronically coupled to a power source through the first resistor of the control module and electronically coupled to the detection pin of the third connector;

the second terminal is electronically coupled to a power source through the second resistor of the control module and electronically coupled to the eighth transmission pin of the second connector;

the third terminal is electronically coupled to ground;

the tenth transmission pin is electronically coupled to the second integrated circuit;

the ground pin is electronically coupled to ground;

the ninth transmission pin and the detection pin of the third connector are electronically coupled to the tenth transmission pin and the ground pin of the fourth connector when the fourth connector is electronically coupled to the third connector;

the detection pin of the third connector electronically coupled to the ground pin of the fourth connector transmits a low-level voltage signal to the electronic switch, thereby closing the electronic switch;

the closed electronic switch transmits the high-level voltage signal to the enabling pin of the system on a chip through the eighth transmission pin and the fifth transmission pin;

upon the enabling pin receiving the high-level voltage signal, the first transmission pin transmits data to the first integrated circuit through the third transmission pin and the sixth transmission pin, and the second transmission pin transmits data to the second integrated circuit through the fourth transmission pin, the seventh transmission pin, the ninth transmission pin, and the tenth transmission pin; and upon the first and second integrated circuits receiving data from the first and second transmission pins, respectively, the system on a chip controls the first display screen to display the first portion of the electronic display, the second display screen through the first integrated circuit to display the second portion of the electronic display, and the third display screen through the second integrated circuit to display the third portion of the electronic display.

9. A framework for forming an electronic display from a plurality of electronic devices each comprising a display screen, the plurality of electronic devices comprising:

a primary electronic device comprising a system on a chip electronically coupled to the display screen of the primary electronic device;

at least one coupling electronic device configured to electronically couple to the primary electronic device; and at least one secondary electronic device configured to electronically couple to the primary electronic device directly or through the at least one coupling electronic device;

wherein each electronic device comprises at least one connector configured to electronically couple to the connector of another electronic device;

wherein the electronic devices of the plurality of electronic devices are electronically coupled together through the connectors; and wherein the system on a chip of the primary electronic device controls the display screen of each of the plurality of electronic devices to display a portion of the electronic display;

the primary electronic device comprises at least one first primary connector and at least one second primary connector;

the primary electronic device is electronically coupled to one of the secondary electronic devices by the at least one first primary connector electronically coupling to the connector of the secondary electronic device;

the coupling electronic device comprises at least one first coupling connector and at least one second coupling connector;

the coupling electronic device is electronically coupled to the primary electronic device by the at least one first coupling connector electronically coupling to the at least one second primary connector of the primary electronic device; and the coupling electronic device is electronically coupled to one of the secondary electronic devices by the at least one second coupling connector electronically coupling to the connector of the secondary electronic device.

10. The framework as in claim 9, wherein:

the at least one coupling electronic device and the at least one secondary electronic device each comprise an integrated circuit electronically coupled to the corresponding display screen; and the system on a chip controls each display screen through the corresponding integrated circuit to display the corresponding portion of the electronic display.

11. The framework as in claim 9, wherein:

the primary electronic device further comprises a first primary control module;

the first primary connector is electronically coupled to the system on a chip through the first primary control module;

the connector of each secondary electronic device comprises a transmission pin electronically coupled to the integrated circuit of the secondary electronic device, and a ground pin electronically coupled to ground;

the first primary control module transmits a high-level voltage signal to the system on a chip when the secondary electronic device is electronically coupled to the primary electronic device; and the system on a chip, upon receiving the high-level voltage signal from the first primary control module when the secondary electronic device is electronically coupled to the primary electronic device, transmits data to the integrated circuit of the secondary electronic device to control the corresponding display screen of the secondary electronic device to display the corresponding portion of the electronic display.

12. The framework as in claim 11, wherein:
the system on a chip comprises a first primary transmission pin and a first enabling pin;
the first primary connector comprises a transmission pin and a detection pin;
the first primary transmission pin and the first enabling pin of the system on a chip are electronically coupled to the transmission pin and the detection pin of the first primary connector, respectively, through the first primary control module;
the first primary control module comprises a first primary electronic switch, a first resistor, and a second resistor;
the first primary electronic switch comprises a first terminal, a second terminal, and a third terminal;
the first terminal of the first primary electronic switch is electronically coupled to a power source through the first resistor of the first primary control module and electronically coupled to the detection pin of the first primary connector;
the second terminal of the first primary electronic switch is electronically coupled to a power source through the second resistor of the first primary control module and electronically coupled to the first enabling pin of the system on a chip;
the third terminal of the first primary electronic switch is electronically coupled to ground;
the transmission pin and the detection pin of the first primary connector are electronically coupled to the transmission pin and the ground pin of the connector of the secondary electronic device, respectively, when the secondary electronic device is electronically coupled to the primary electronic device;
when the connector of the secondary electronic device is electronically coupled to the first primary connector of the primary electronic device, the detection pin of the first primary connector electronically coupled to the ground pin of the connector of the secondary electronic device transmits a low-level voltage signal to the first primary electronic switch, thereby closing the first primary electronic switch;
the closed first primary electronic switch transmits the high-level voltage signal to the first enabling pin of the system on a chip; and
the first primary transmission pin of the system on a chip, upon the first enabling pin receiving the high-level voltage signal from the first primary electronic switch, transmits data to the integrated circuit of the secondary electronic device through the transmission pin of the first primary connector and the transmission pin of the connector of the secondary electronic device.

13. The framework as in claim 12, wherein:
the primary electronic device further comprises a second primary control module;
the second primary connector is electronically coupled to the system on a chip through the second primary control module;
the second primary control module transmits a high-level voltage signal to the system on a chip when the first coupling connector of the coupling electronic device is electronically coupled to the second primary connector of the primary electronic device;
the system on a chip, upon receiving the high-level voltage signal from the second primary control module when the first coupling connector of the coupling electronic device is electronically coupled to the second primary connector of the primary electronic device, transmits data to the integrated circuit of the coupling electronic device to control the corresponding display screen of the coupling electronic device to display the corresponding portion of the electronic display;
the coupling electronic device further comprises a coupling control module;
the second coupling connector is electronically coupled to the first coupling connector through the coupling control module;
the coupling control module transmits a high-level voltage signal to the system on a chip through the first coupling connector and the second primary connector when the connector of the secondary electronic device is electronically coupled to the second coupling connector of the coupling electronic device; and
the system on a chip, upon receiving the high-level voltage signal from the coupling control module when the connector of the secondary electronic device is electronically coupled to the second coupling connector of the coupling electronic device, transmits data to the integrated circuit of the secondary electronic device to control the corresponding display screen of the secondary electronic device to display the corresponding portion of the electronic display.

14. The framework as in claim 13, wherein:
the system on a chip comprises a second primary transmission pin, a second enabling pin, a third primary transmission pin, and a third enabling pin;
the second primary connector comprises a first connecting transmission pin, a detection pin, a second connecting transmission pin, and a third connecting transmission pin;
the second transmission pin and the second enabling pin of the system on a chip are electronically coupled to the first connecting transmission pin and the detection pin of the second primary connector, respectively, through the second primary control module;
the third primary transmission pin and the third enabling pin are electronically coupled to the second connecting transmission pin and the third connecting transmission pin, respectively;
the second primary control module comprises a second primary electronic switch, a first resistor, and a second resistor;
the second primary electronic switch of the second primary control module comprises a first terminal, a second terminal, and a third terminal;
the first terminal of the second primary electronic switch is electronically coupled to a power source through the first resistor of the second primary control module and electronically coupled to the detection pin of the second primary connector;

the second terminal of the second primary electronic switch is electronically coupled to a power source through the second resistor of the second primary control module and electronically coupled to the second enabling pin of the system on a chip;

the third terminal of the first primary electronic switch is electronically coupled to ground;

the first coupling connector comprises a first coupling transmission pin, a ground pin, a second coupling transmission pin, and a third coupling transmission pin;

the first coupling transmission pin and the ground pin of the first coupling connector are electronically coupled to the integrated circuit of the coupling electronic device and to ground, respectively;

the first connecting transmission pin and the detection pin of the second primary connector are electronically coupled to the first coupling transmission pin and the ground pin of the first coupling connector of the coupling electronic device, respectively, when the coupling electronic device is electronically coupled to the primary electronic device;

when the first coupling connector of the coupling electronic device is electronically coupled to the second primary connector of the primary electronic device, the detection pin of the second primary connector electronically coupled to the ground pin of the first coupling connector of the coupling electronic device transmits a low-level voltage signal to the second primary electronic switch, thereby closing the second primary electronic switch;

the closed second primary electronic switch transmits the high-level voltage signal to the second enabling pin of the system on a chip;

the second primary transmission pin of the system on a chip, upon the second enabling pin receiving the high-level voltage signal from the second primary electronic switch, transmits data to the integrated circuit of the coupling electronic device through the first connecting transmission pin and the first coupling transmission pin;

the second coupling connector comprises a fourth coupling transmission pin and a detection pin;

the second coupling transmission pin and the third coupling transmission pin of the first coupling connector are electronically coupled to the fourth coupling transmission pin and the detection pin of the second coupling connector, respectively, through the coupling control module;

the coupling control module comprises a coupling electronic switch, a first resistor, and a second resistor;

the coupling electronic switch of the coupling control module comprises a first terminal, a second terminal, and a third terminal;

the first terminal of the coupling electronic switch is electronically coupled to a power source through the first resistor of the coupling control module and electronically coupled to the detection pin of the second coupling connector;

the second terminal of the coupling electronic switch is electronically coupled to a power source through the second resistor of the coupling control module and electronically coupled to the third coupling transmission pin of the first coupling connector;

the third terminal of the coupling electronic switch is electronically coupled to ground;

the second connecting transmission pin and the third connecting transmission pin of the second primary connector are electronically coupled to the second coupling transmission pin and the third coupling transmission pin of the first coupling connector of the coupling electronic device, respectively, when the coupling electronic device is electronically coupled to the primary electronic device;

the fourth coupling transmission pin and the detection pin of the second coupling connector are electronically coupled to the transmission pin and the ground pin of the connector of the secondary electronic device, respectively, when the connector of the secondary electronic device is electronically coupled to the second coupling connector of the coupling electronic device;

when the connector of the secondary electronic device is electronically coupled to the second coupling connector of the coupling electronic device, the detection pin of the second coupling connector electronically coupled to the ground pin of the connector of the secondary electronic device transmits a low-level voltage signal to the coupling electronic switch, thereby closing the coupling electronic switch;

the closed coupling electronic switch transmits the high-level voltage signal to the third enabling pin of the system on a chip through the third coupling transmission pin and the third connecting transmission pin; and the third primary transmission pin of the system on a chip, upon the third enabling pin receiving the high-level voltage signal from the coupling electronic switch, transmits data to the integrated circuit of the secondary electronic device through the second connecting transmission pin, the second coupling transmission pin, the fourth coupling transmission pin, and the transmission pin of the connector of the secondary electronic device.

15. The framework as in claim 9, wherein:

the primary electronic device further comprises a primary control module;

the first primary connector is electronically coupled to the system on a chip through the primary control module;

the connector of each secondary electronic device comprises a transmission pin electronically coupled to the integrated circuit of the secondary electronic device, and a ground pin electronically coupled to ground;

the primary control module transmits a high-level voltage signal to the system on a chip when the secondary electronic device is electronically coupled to the primary electronic device;

the system on a chip, upon receiving the high-level voltage signal from the primary control module when the secondary electronic device is electronically coupled to the primary electronic device, transmits data to the integrated circuit of the secondary electronic device to control the corresponding display screen of the secondary electronic device to display the corresponding portion of the electronic display;

the coupling electronic device further comprises a coupling control module;

the second coupling connector is electronically coupled to the first coupling connector through the coupling control module;

the coupling control module transmits a high-level voltage signal to the system on a chip through the first coupling connector and the second primary connector when the first coupling connector of the coupling electronic device is electronically coupled to the second primary connector of the primary electronic device, and when the connector of the secondary electronic device is electronically coupled to the second coupling connector of the coupling electronic device; and the system on a chip, upon receiving the high-level voltage signal from the coupling control module, transmits data to the integrated circuit of the coupling electronic device and the integrated circuit of the secondary electronic device to control the corresponding display screen of the coupling electronic device and the corresponding display screen of the secondary electronic device to display the corresponding portions of the electronic display.

16. The framework as in claim 15, wherein:

the system on a chip comprises a first primary transmission pin and a first enabling pin;

the first primary connector comprises a transmission pin and a detection pin;

the first primary transmission pin and the first enabling pin of the system on a chip are electronically coupled to the transmission pin and the detection pin of the first primary connector, respectively, through the primary control module;

the primary control module comprises a primary electronic switch, a first resistor, and a second resistor;

the primary electronic switch comprises a first terminal, a second terminal, and a third terminal;

the first terminal of the primary electronic switch is electronically coupled to a power source through the first resistor of the primary control module and electronically coupled to the detection pin of the first primary connector;

the second terminal of the primary electronic switch is electronically coupled to a power source through the second resistor of the primary control module and electronically coupled to the first enabling pin of the system on a chip;

the third terminal of the primary electronic switch is electronically coupled to ground;

the transmission pin and the detection pin of the first primary connector are electronically coupled to the transmission pin and the ground pin of the connector of the secondary electronic device, respectively, when the secondary electronic device is electronically coupled to the primary electronic device;

when the connector of the secondary electronic device is electronically coupled to the first primary connector of the primary electronic device, the detection pin of the first primary connector electronically coupled to the ground pin of the connector of the secondary electronic device transmits a low-level voltage signal to the primary electronic switch, thereby closing the primary electronic switch;

the closed primary electronic switch transmits the high-level voltage signal to the first enabling pin of the system on a chip; and the first primary transmission pin of the system on a chip, upon the first enabling pin receiving the high-level voltage signal from the primary electronic switch, transmits data to the integrated circuit of the secondary electronic device through the transmission pin of the first primary connector and the transmission pin of the connector of the secondary electronic device.

17. The framework as in claim 16, wherein:

the system on a chip comprises a second primary transmission pin, a third primary transmission pin, and a second enabling pin;

the second primary connector comprises a first connecting transmission pin, a second connecting transmission pin, and a third connecting transmission pin;

the second primary transmission pin, the third primary transmission pin, and the second enabling pin of the system on a chip are electronically coupled to the first connecting transmission pin, the second connecting transmission pin, and the third connecting transmission pin of the second primary connector, respectively;

the first coupling connector comprises a first coupling transmission pin, a second coupling transmission pin, and a third coupling transmission pin;

the first coupling transmission pin of the first coupling connector is electronically coupled to the integrated circuit of the coupling electronic device;

the second coupling connector comprises a fourth coupling transmission pin and a detection pin;

the second coupling transmission pin and the third coupling transmission pin of the first coupling connector are electronically coupled to the fourth coupling transmission pin and the detection pin of the second coupling connector, respectively, through the coupling control module;

the coupling control module comprises a coupling electronic switch, a first resistor, and a second resistor;

the coupling electronic switch of the coupling control module comprises a first terminal, a second terminal, and a third terminal;

the first terminal of the coupling electronic switch is electronically coupled to a power source through the first resistor of the coupling control module and electronically coupled to the detection pin of the second coupling connector;

the second terminal of the coupling electronic switch is electronically coupled to a power source through the second resistor of the coupling control module and electronically coupled to the third coupling transmission pin of the first coupling connector;

the third terminal of the coupling electronic switch is electronically coupled to ground;

the second connecting transmission pin and the third connecting transmission pin of the second primary connector are electronically coupled to the second coupling transmission pin and the third coupling transmission pin of the first coupling connector of the coupling electronic device, respectively, when the coupling electronic device is electronically coupled to the primary electronic device;

the fourth coupling transmission pin and the detection pin of the second coupling connector are electronically coupled to the transmission pin and the ground pin of the connector of the secondary electronic device, respectively, when the connector of the secondary electronic device is electronically coupled to the second coupling connector of the coupling electronic device;

when the connector of the secondary electronic device is electronically coupled to the second coupling connector of the coupling electronic device, the detection pin of the second coupling connector electronically coupled to the ground pin of the connector of the secondary electronic device transmits a low-level voltage signal to the coupling electronic switch, thereby closing the coupling electronic switch;

the closed coupling electronic switch transmits a high-level voltage signal to the second enabling pin of the system on a chip through the third coupling transmission pin and the third connecting transmission pin;

the second primary transmission pin of the system on a chip, upon the second enabling pin receiving the high-level voltage signal from the coupling electronic switch, transmits data to the integrated circuit of the coupling electronic device through the first connecting transmission pin and the first coupling transmission pin; and the third primary transmission pin of the system on a chip, upon the second enabling pin receiving the high-level voltage signal from the coupling electronic switch, transmits data to the integrated circuit of the secondary electronic device through the second connecting transmission pin, the second coupling transmission pin, the fourth coupling transmission pin, and the transmission pin of the connector of the secondary electronic device.

\* \* \* \* \*